United States Patent [19]
Tseng

[11] Patent Number: 5,792,688
[45] Date of Patent: Aug. 11, 1998

[54] METHOD TO INCREASE THE SURFACE AREA OF A STORAGE NODE ELECTRODE, OF AN STC STRUCTURE, FOR DRAM DEVICES, VIA FORMATION OF POLYSILICON COLUMNS

[75] Inventor: Horng-Huei Tseng, Hsinchu, Taiwan

[73] Assignee: Vanguard International Semiconductor Corporation, Hsin-Chu, Taiwan

[21] Appl. No.: 746,061

[22] Filed: Nov. 6, 1996

[51] Int. Cl.$^6$ .................................... H01L 21/8242
[52] U.S. Cl. ............... 438/253; 438/254; 438/397; 438/240
[58] Field of Search ................ 438/238, 239, 438/240, 253, 254, 381, 396, 397; 257/306, 309, 310

[56] References Cited

U.S. PATENT DOCUMENTS

| | | | |
|---|---|---|---|
| 5,084,405 | 1/1992 | Fazan et al. | 438/253 |
| 5,290,729 | 3/1994 | Hayashide et al. | 437/60 |
| 5,447,882 | 9/1995 | Kim | 437/60 |
| 5,580,811 | 12/1996 | Kim | 438/253 |

Primary Examiner—Joni Chang
Attorney, Agent, or Firm—George O. Saile; Stephen B. Ackerman

[57] ABSTRACT

A method of creating an STC structure, used for high density, DRAM designs, has been developed. The process consists of creating a lower, or storage node electrode, for the STC structure, consisting of a flat, polysilicon plug, contacting an underlying transistor region, and of an upper polysilicon shape, comprised of polysilicon columns, extending between about 2500 to 6000 Angstroms, above the top surface of the flat, polysilicon plug. The flat, polysilicon plug is formed via creation of a capacitor contact hole, in an insulator layer, followed by polysilicon deposition, and RIE etch back, creating the flat, polysilicon plug, recessed in a lower portion of the capacitor contact hole. Another polysilicon deposition, and anisotropic RIE procedure, results in the formation of polysilicon columns, on the sides of the upper portion of the capacitor contact hole. Removal of insulator layers expose the storage node electrode, comprised of polysilicon columns, overlying, and extending above, the underlying flat, polysilicon plug.

25 Claims, 4 Drawing Sheets

5,792,688

1

METHOD TO INCREASE THE SURFACE AREA OF A STORAGE NODE ELECTRODE, OF AN STC STRUCTURE, FOR DRAM DEVICES, VIA FORMATION OF POLYSILICON COLUMNS

BACKGROUND OF THE INVENTION (1) Field of the Invention

The present invention relates to a method used to fabricate high density, semiconductor, DRAM cells, with stacked capacitor structures, and more specifically to a process used to increase the surface area of a storage node electrode, used in the stacked capacitor structure.

(2) Description of the Prior Art

The objectives of the semiconductor industry are to continually improve device performance, while still attempting to decrease the manufacturing cost of specific semiconductor chips. These objectives have been in part realized by the ability of the semiconductor industry to produce chips with sub-micron features, or micro-miniaturization. Smaller features allow the reduction in performance degrading capacitances and resistances to be realized. In addition smaller features result in a smaller chip, however possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 256 million cells per chip, or greater, has resulted in a specific cell in which a smaller transfer gate transistor is being used, resulting in less of an overlying area for placement of overlying STC structures.

One method of maintaining, or increasing STC capacitance, while still decreasing the lateral dimension of the capacitor, has been the use of rough, or hemispherical grained, (HSG), polysilicon layers. Hayashide, in U.S. Pat. No. 5,290,729, describes a storage node, or lower electrode, of an STC structure, in which the surface area of the lower electrode is increased via growth of HSG polysilicon, on the top surface of the lower electrode. However the HSG polysilicon process can be difficult to control, based on the narrow range of deposition and anneal conditions, needed to obtain the desired HSG characteristics. Another method used for achieving the desired electrode surface area is the creation of the lower electrodes with protruding shapes of polysilicon, or polysilicon columns, thus resulting in a greater electrode surface area then would have been achieved with conventional flat surfaces. Kim, in U.S. Pat.

2

No. 5,447,882, describes such an STC structure, comprised of a lower electrode, formed by creating protruding polysilicon features, via patterning of a polysilicon layer. However for the Kim invention, the protruding polysilicon shapes, of the lower electrode, are limited by the thickness of the polysilicon layer, thus limiting the resulting increase in capacitance.

This invention will describe a process in which a storage node electrode, or lower electrode of an STC structure is also fabricated using protruding polysilicon shapes, or columns. However in this invention the polysilicon columns are created by forming polysilicon spacers on the sides of a capacitor contact hole. The capacitor contact hole is in turn formed in a dielectric layer, thus the height, or increased surface area of the polysilicon columns, is a function of the thickness of the dielectric layer.

SUMMARY OF THE INVENTION

It is an object of this invention to create a DRAM device, with an STC structure, in which the surface area of the storage node electrode, of the STC structure is increased, without increasing the width of the STC structure.

It is another object of this invention to form the storage node electrode, of the STC structure, by initially creating a lower segment of the storage node electrode, comprised of a conductive material, such as polysilicon, with the lower segment embedded in a dielectric layer, and contacting a region of an underlying transfer gate transistor, and followed by the creation of an upper segment of the storage node electrode, comprised of polysilicon columns, overlying the lower segment of the storage node electrode, and extending upwards.

It is yet another object of this invention to create the polysilicon columns, directly on the flat, lower segment of the storage node electrode, via creation of polysilicon spacers, formed on the sides of a capacitor contact hole, in a thick dielectric layer, via polysilicon deposition and chemical mechanical polishing procedures.

In accordance with the present invention a method for fabricating increased capacitance DRAM devices, via use of an STC structure, comprised of a storage node electrode with increased surface area, has been developed. Transfer gate transistors comprised of: a thin gate insulator; polysilicon gate structures, formed from a first polysilicon layer; lightly doped source and drain regions; insulator spacers on the sidewalls of the polysilicon gate structure; and heavily doped source and drain regions; are formed on a semiconductor substrate. A thin layer of silicon nitride is used to overlie the transfer gate transistor region, followed by the deposition of a first silicon oxide layer. A contact hole opening, in the first silicon oxide—thin silicon nitride layer, is made to expose the source and drain region of the transfer gate transistor. A second polysilicon layer is deposited, completely filling the contact hole opening, and contacting the source and drain region of the transfer gate transistor. Reactive ion etching procedures are used to recess the second polysilicon layer in the contact hole opening, creating a flat polysilicon plug, recessed in the lower portion of the contact hole opening. A third polysilicon layer is deposited: on the flat, polysilicon plug, recessed in the lower portion of the contact hole opening; on the sides of the upper portion of the contact hole opening, not filled with the flat, polysilicon plug; and on the top surface of the first silicon oxide layer, in regions outside the contact hole opening. A second layer of silicon oxide is deposited, completely filling the upper portion of the contact hole opening, and also overlying the third polysilicon layer in regions outside the contact hole opening. Chemical mechanical polishing procedures are then used to remove the second silicon oxide layer, exposing the third polysilicon layer in regions outside the contact hole opening, and leaving a second silicon oxide fill in the contact hole opening. Additional chemical mechanical procedures are then performed to remove the third polysilicon layer from the top surface of the underlying first silicon oxide layer, in regions outside the contact hole opening. Wet etch procedures are next employed to completely remove the second silicon oxide fill, from the contact hole opening, also completely removing the first silicon oxide layer from regions outside the contact hole opening, exposing the transfer gate transistor, covered with the thin layer of silicon nitride. The resulting storage node electrode is comprised of polysilicon columns, created from the deposition of third polysilicon layer on the sides of the contact hole opening, overlying the flat, polysilicon plug. A capacitor dielectric layer is next formed on the storage node electrode structure, followed by the creation of an upper electrode, or plate electrode structure, completing the processing of the STC structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a DRAM device, with increased capacitance, resulting from the use of a STC structure that features a storage node electrode, comprised of polysilicon columns, fabricated via the use of polysilicon spacers, on the sides of a capacitor contact hole opening, will now be described. The transfer gate transistor, used for this DRAM device, in this invention, will be an N channel device. However the STC structure, with the increased surface area described in this invention, can also be applied to P channel, transfer gate transistor.

Figure 1:
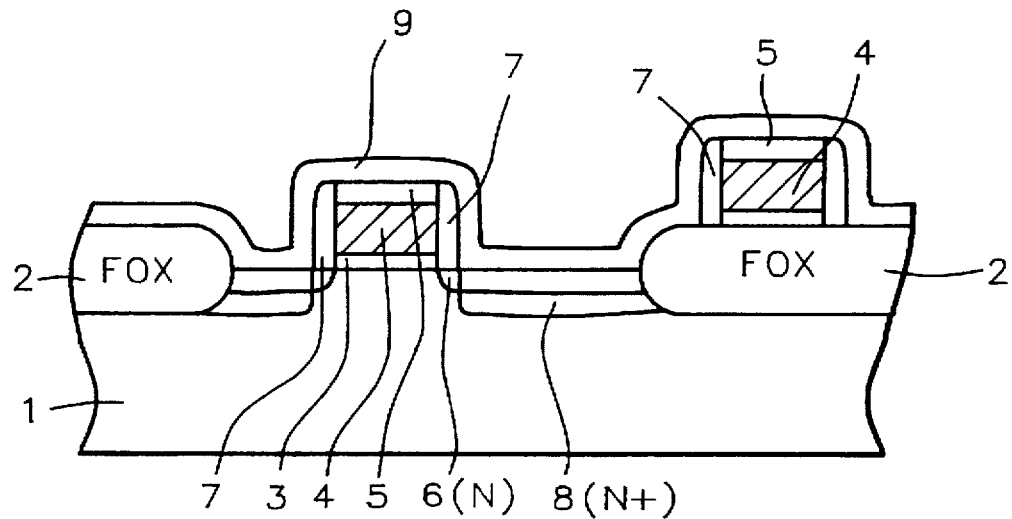
FIGS. 1-7, which schematically shows, in cross-sectional style, the key fabrication stages used in the creation of a DRAM device, with a STC structure, with an increased surface area, resulting from a storage node electrode structure comprised of polysilicon columns, on a flat, lower polysilicon shape.

Referring to FIG. 1, a P type, semiconductor substrate, 1, with a <100>, single crystalline orientation, is used. Field oxide, (FOX), regions, 2, are used for purposes of isolation. Briefly the FOX regions, 2, are formed via thermal oxidation, in an oxygen-steam ambient, at a temperature between about 850° to 1050° C., to a thickness between about 3000 to 5000 Angstroms. A patterned oxidation resistant mask of silicon nitride-silicon oxide is used to prevent FOX regions, 2, from growing on areas of substrate, 1, to be used for subsequent device regions. After the growth of the FOX regions, 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer, 3, of silicon oxide is thermally grown in an oxygen-steam ambient, at a temperature between about 850° to 1050° C., to a thickness between about 50 to 200 Angstroms. A first polysilicon layer, 4, is next deposited using low pressure chemical vapor deposition, (LPCVD), procedures, at a temperature between about 500° to 700° C., to a thickness between about 1500 to 4000 Angstroms. The polysilicon layer can either be grown intrinsically and doped via ion implantation of arsenic or phosphorous, at an energy between about 30 to 80 KeV, at a dose between about 1E13 to 1E16 atoms/cm$^2$, or grown using in situ doping procedures, via the incorporation of either arsine or phosphine to the silane ambient. A first silicon oxide layer, 5, used as a cap insulator layer, is next grown via the use of either LPCVD or plasma enhanced chemical vapor deposition, (PECVD), procedures, to a thickness between about 600 to 1200 Angstroms. Conventional photolithographic and reactive ion etching, (RIE), procedures, using CHF$_3$ as an etchant for silicon oxide layer, 5, and using Cl$_2$ as an etchant for polysilicon layer, 4, are used to create the polysilicon gate structures, 4, with overlying cap insulator layer, 5, shown schematically in FIG. 1. Photoresist removal is accomplished via plasma oxygen ashing and careful wet cleans.

A lightly doped source and drain region, 6, is next formed via ion implantation of phosphorous, at an energy between about 20 to 50 KeV, at a dose between about 1E13 to 1E14 atoms/cm$^2$. A second insulator layer of silicon oxide is then deposited using either LPCVD or PECVD procedures, at a temperature between about 400° to 700° C., to a thickness between about 1500 to 4000 Angstroms, followed by an anisotropic RIE procedure, using CHF$_3$ as an etchant, creating insulator spacer, 7, on the sidewalls of polysilicon gate structures, 4. A heavily doped source and drain region, 8, is then formed via ion implantation of arsenic, at an energy between about 30 to 100 KeV, at a dose between about 1E15 to 5E16 atoms/cm$^2$. The result of these procedures are schematically shown in FIG. 1. A silicon nitride layer, 9, is next deposited using LPCVD or PECVD procedures, at a temperature between about 700° to 750° C., to a thickness between about 800 to 1600 Angstroms. The result of these of these procedures are schematically shown in FIG. 1.

Figure 2:
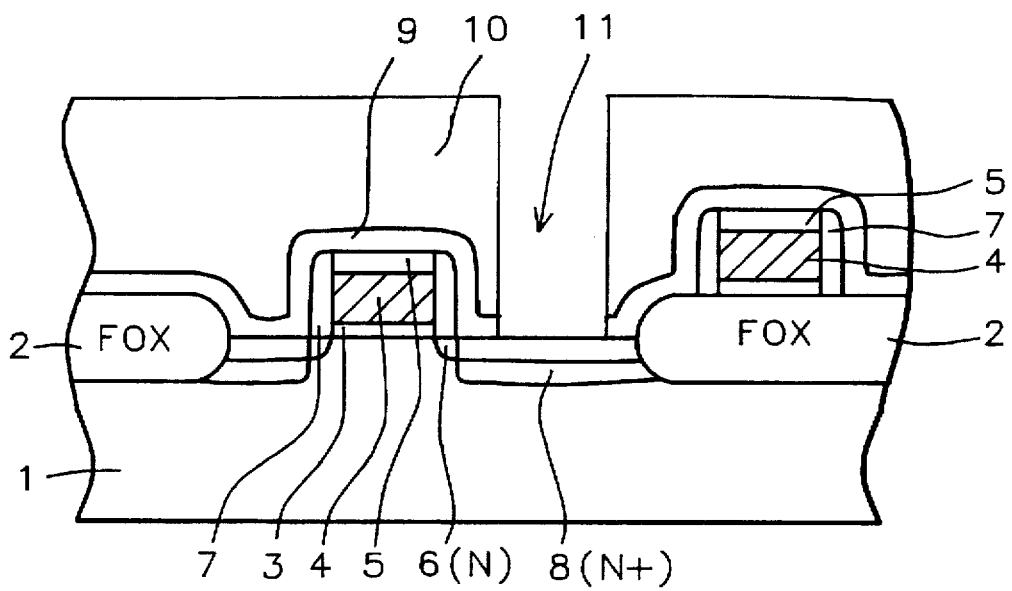

A third insulator layer of silicon oxide, 10, is next deposited via LPCVD or PECVD procedures, at a temperature between about 500° to 700° C., to a thickness between about 4000 to 10000 Angstroms. Chemical mechanical polishing, (CMP), procedures are next used to planarize silicon oxide layer, 10. Conventional photolithographic and RIE procedures, using CHF$_3$ as an etchant, are used to open contact hole, 11, in silicon oxide layer, 10, to a depth between about 4000 to 10000 Angstroms, to be used for the capacitor contact, exposing the top surface of heavily doped source and drain region, 8, shown schematically in FIG. 2. Photoresist removal is performed via use of plasma oxygen ashing and careful wet cleans.

Figure 3:
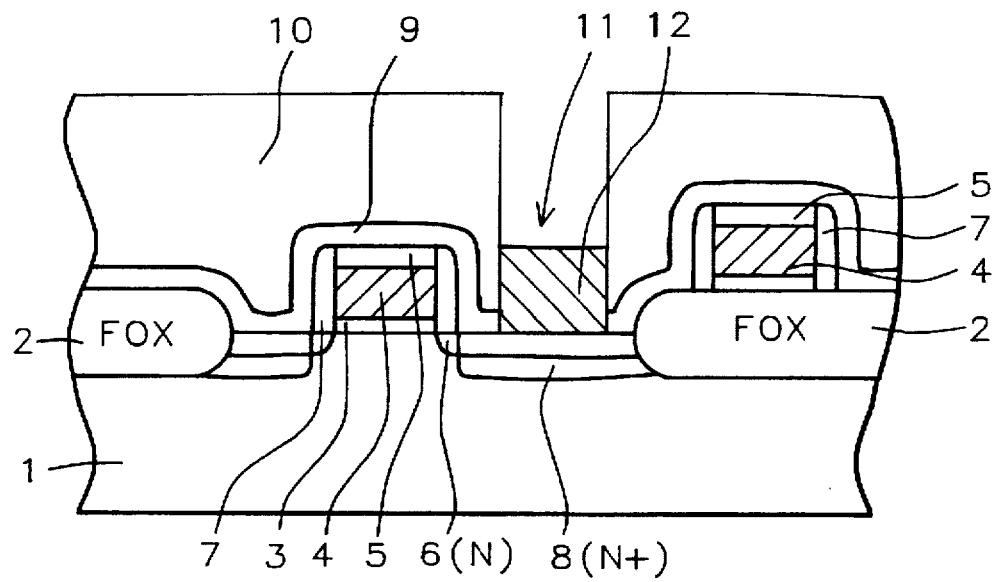

A second layer of polysilicon is next deposited, via LPCVD procedures, at a temperature between about 500° to 700° C., to a thickness between about 1000 to 3000 Angstroms. The second polysilicon layer can be deposited intrinsically and doped via ion implantation of either phosphorous or arsenic, or the second polysilicon layer can be deposited using in situ doping procedures, via the addition of either phosphine or arsine, to a silane ambient. RIE procedures, using Cl$_2$ as an etchant, are again employed to remove unwanted second polysilicon layer from areas outside contact hole, 11, and to continue the RIE procedure to recess the second polysilicon layer, creating a flat, polysilicon plug, 12, in the bottom portion of contact hole, 11. The height of polysilicon plug, 12, in the bottom portion of contact hole opening, 11, is between 1500 to 4000 Angstroms, leaving a top portion of contact hole opening, 11, between about 2500 to 6000 Angstroms, void of polysilicon. This is shown schematically in FIG. 3.

Another alternative for creating a flat, contact plug, is to use a conductive metal, such as tungsten, in place of polysilicon. This can be accomplished via LPCVD deposition of tungsten, followed by RIE processing, removing unwanted tungsten from areas outside contact hole, 11, followed by a continuation of the RIE procedure, resulting in the recessing of the flat, tungsten plug, in the lower portion of contact hole opening, 11. The flat tungsten plug can also be formed via selective deposition of tungsten in contact hole, 11, via an LPCVD procedure, at a temperature between about 400° to 800° C., to a thickness between about 1500 to 4000 Angstroms, using $WF_6$ and $SiH_4$ as reactants. The selective tungsten deposition eliminates the need for the RIE etch back procedure.

Figure 4:
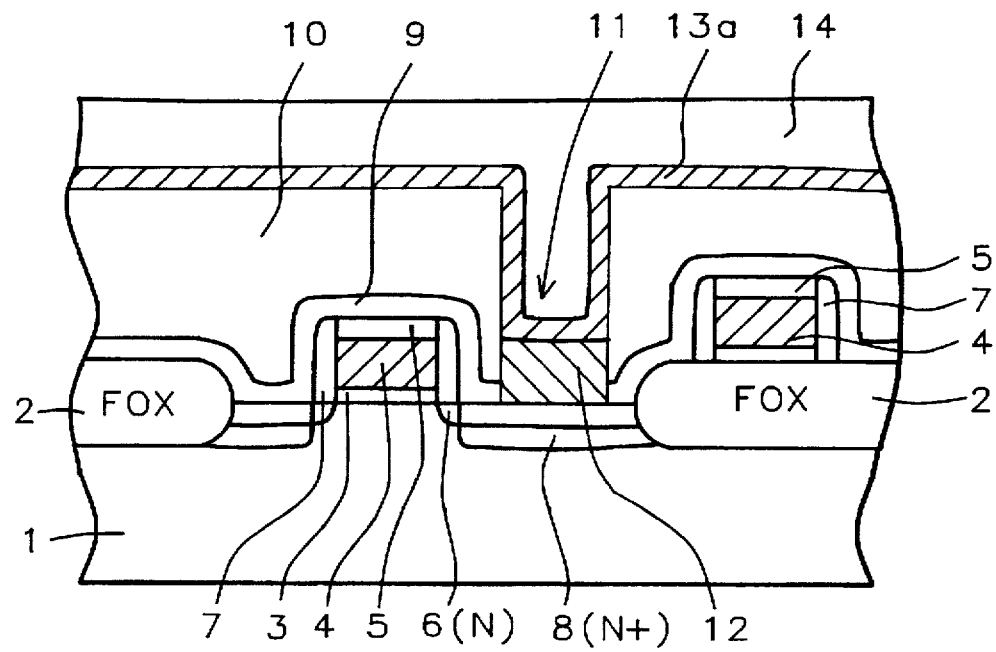
Figure 5:
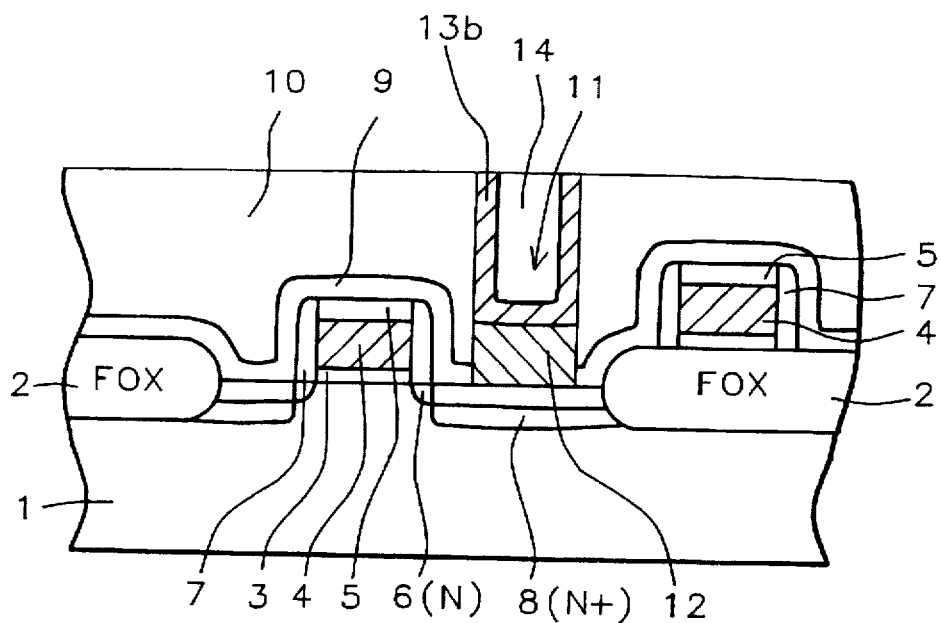

A third layer of polysilicon, 13a, is next deposited, using LPCVD procedures, at a temperature between about 500° to 700° C., to a thickness between about 500 to 2000 Angstroms, contouring the sides of the top portion of contact hole opening, 11. Polysilicon layer, 13a, is again either grown intrinsically, and doped via ion implantation of either arsenic or phosphorous, or polysilicon layer, 13a, is grown using in situ doping procedures, via the addition of either arsine or phosphine, to a silane ambient. A fourth layer of silicon oxide, 14 is deposited, using LPCVD or PECVD procedures, at a temperature between about 500° to 700° C., to a thickness between about 500 to 2000 Angstroms, completely filling the top portion of contact hole opening, 11. This is schematically illustrated in FIG. 4. A series of CMP procedures are next used to first polish back silicon oxide layer, 14, exposing polysilicon layer, 13a, which overlies silicon oxide layer, 10, in regions outside contact hole opening, 11. Next another polishing procedure is employed to remove polysilicon layer, 13a, from regions outside contact hole opening, 11. This procedure creates polysilicon spacers, 13b, on the sides of the top portion of contact hole opening, 11, overlying flat, polysilicon plug, 12, in the bottom portion of contact hole opening, 11. The series of CMP procedures also result in exposure of silicon oxide layer, 10, in regions outside contact hole opening, 11, while silicon oxide layer, 14, remains in the top portion of contact hole opening, 11, between polysilicon spacers, 13b. The result of these procedures are schematically shown in FIG. 5.

Figure 6:
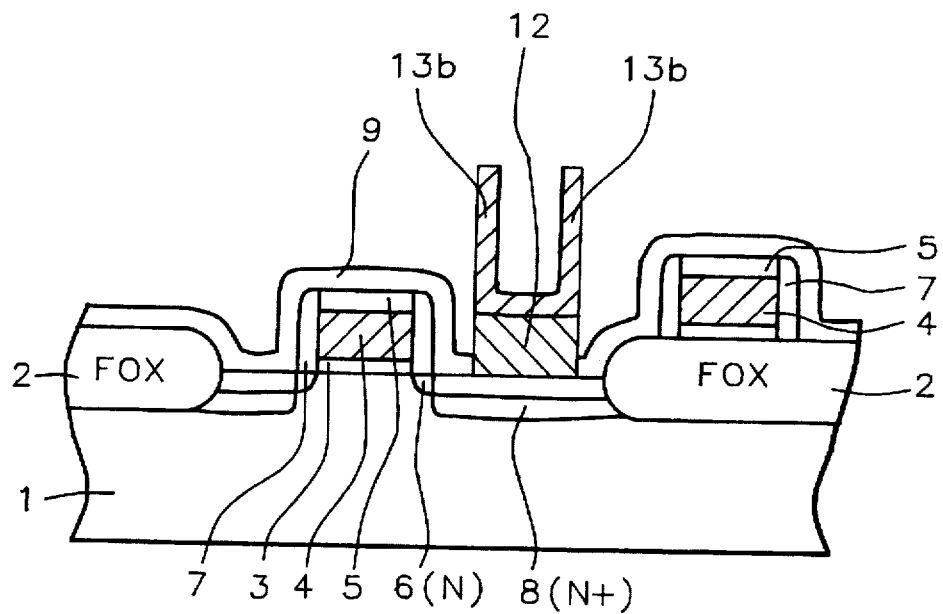

A selective wet etch, using either a dilute HF, or a buffered HF solution, at a temperature between about 24° to 26° C., is used to remove silicon oxide layer, 10, as well as silicon oxide layer, 14. This selective wet etch does not attack silicon nitride layer, 9, protecting the underlying transfer gate transistor. The result of this procedure is shown schematically in FIG. 6. A storage node electrode, comprised of a bottom segment of a flat, polysilicon plug, and a top segment, comprised of polysilicon columns, 13b, are achieved. The height of polysilicon columns, 13b, which will be responsible for the STC surface area increase, thus the DRAM device enhancement, is created by formation of polysilicon spacers on the sides of contact hole opening, 11. The height of polysilicon columns, 13b, between about 2500 to 6000 Angstroms, is a function of the depth of contact hole opening, 11, or the thickness of silicon oxide layer, 10, minus the height of flat, polysilicon plug, 12. Therefore if a greater increase in capacitance is desired the thickness of silicon oxide layer, 10, can be increased, or the thickness of flat, polysilicon plug, 12, can be decreased.

Figure 7:
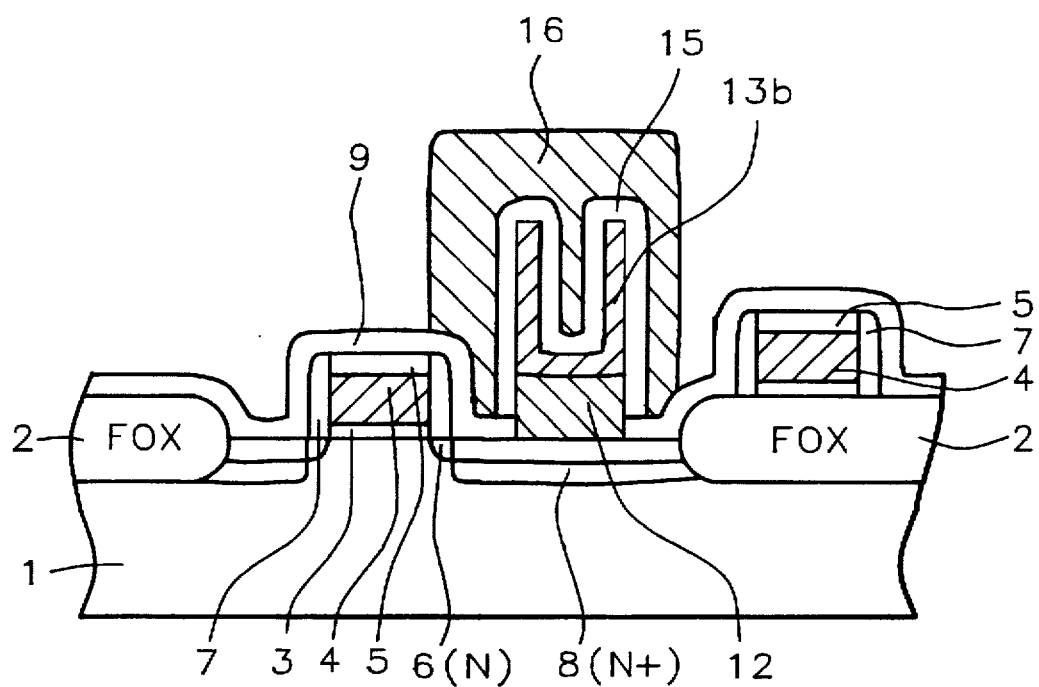

FIG. 7 schematically shows the completion of the STC structure. First a dielectric layer, 15, is formed, overlying the storage node electrode, comprised of polysilicon columns, 13b, and flat, polysilicon plug, 12. Dielectric layer, 15, can be an insulator layer possessing a high dielectric constant, such as $Ta_2O_5$, obtained via radio frequency (r.f.) sputtering techniques, at a thickness between about 10 to 100 Angstroms. Dielectric layer, 15, can also be ONO, (Oxidized—silicon Nitride—silicon Oxide). The ONO layer is formed by initially growing a silicon dioxide layer via a thermal oxidation, between about 10 to 50 Angstroms, followed by the deposition of a silicon nitride layer, between about 10 to 20 Angstroms. Subsequent thermal oxidation of the silicon nitride layer results in the formation of a silicon oxynitride layer on silicon oxide, at a silicon oxide equivalent thickness of between about 40 to 80 Angstroms. Finally another layer of polysilicon is deposited, via LPCVD procedures, at a temperature between about 500° to 700° C., to a thickness between about 1000 to 2000 Angstroms. Doping of this polysilicon layer is accomplished via deposition using in situ doping procedures, adding phosphine to a silane ambient. Photolithographic and RIE procedures, using $Cl_2$ as an etchant, are next employed to create polysilicon upper electrode, or plate electrode, 16, shown schematically in FIG. 7. Photoresist is again removed via plasma oxygen ashing and careful wet cleans.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a dynamic random access memory DRAM device, on a semiconductor substrate, comprised of underlying transistors; with gate insulators, gate electrode structures, formed from a first silicon oxide, and a first polysilicon layer, insulator sidewall spacers, formed from a second silicon oxide layer, source and drain regions, and an overlying stacked capacitor STC structure; with a storage node electrode, a dielectric layer, and an overlying plate electrode, and with said storage node electrode, comprised of a lower shape of a flat, polysilicon plug, contacting said source and drain regions of said underlying transistor, and with an upper shape of polysilicon columns, extending above a top surface of said flat, polysilicon plug, comprising the steps of:

depositing a silicon nitride layer on said underlying transistor, of said DRAM device;

depositing a third silicon oxide layer on said silicon nitride layer;

opening a contact hole, in said third silicon oxide layer, and in said silicon nitride layer, to expose top surface of said source and drain region, of said underlying transistor;

depositing a second polysilicon layer on top surface of said third silicon oxide layer, and on the top surface of said source and drain region, exposed in said contact hole;

anisotropic etching of said second polysilicon layer, removing said second polysilicon from the top surface of said third silicon oxide layer, regions outside said contact hole, and recessing said second polysilicon layer, in said contact hole, creating said flat, polysilicon plug in bottom portion of said contact hole;

depositing a third polysilicon layer on the top surface of said third silicon oxide layer, the regions outside said contact hole, and depositing said third polysilicon layer on sides of said contact hole, and on the top surface of said flat, polysilicon plug, in the bottom portion of said contact hole;

depositing a fourth silicon oxide layer on said third polysilicon layer, completely filling top portion of said contact hole;

a first chemical mechanical polishing procedure to remove said fourth silicon oxide layer from top surface of said third polysilicon layer, in the regions outside said contact hole, exposing the top surface of said third polysilicon layer, while leaving said fourth silicon oxide layer in the top portion of said contact hole;

a second chemical mechanical polishing procedure to remove said third polysilicon layer from the top surface of said third silicon oxide layer, in the regions outside said contact hole, creating said polysilicon columns on the sides of the top portion of said contact hole, overlying said flat, polysilicon plug, in the bottom portion of said contact hole, and leaving said fourth silicon oxide layer in the top portion of said contact hole, between said polysilicon columns;

removal of said third silicon oxide layer, and of said fourth silicon oxide layer, exposing said storage node electrode, and exposing said underlying transistor of said DRAM device, covered with said silicon nitride layer, with said storage node electrode comprised of underlying, said flat, polysilicon plug, and said overlying polysilicon columns, extending above the top surface of underlying, said flat, polysilicon plug;

forming said dielectric layer on said storage node electrode;

depositing a fourth polysilicon layer on said dielectric layer; and patterning of said fourth polysilicon layer to form said plate electrode of said STC structure.

2. The method of claim 1, wherein said third silicon oxide layer is deposited using low pressure chemical vapor deposition (LPCVD) or plasma enhanced chemical vapor deposition (PECVD) procedures, at a temperature between about 500° to 700° C., to a thickness between about 4000 to 10000 Angstroms.

3. The method of claim 1, wherein said contact hole is formed via reactive ion etch RIE procedures, using $CHF_3$ as an etchant, to a depth between about 4000 to 10000 Angstroms.

4. The method of claim 1, wherein said second polysilicon layer is deposited using LPCVD procedures, at a temperature between about 500° to 700° C., to a thickness between about 1000 to 3000 Angstroms.

5. The method of claim 1, wherein said flat, polysilicon plug, in the bottom portion of said contact hole, is formed via RIE procedures, using $Cl_2$ as an etchant, with a height of said flat, polysilicon plug between about 1500 to 4000 Angstroms.

6. The method of claim 1, wherein said third polysilicon layer is deposited using LPCVD procedures, at a temperature between about 500° to 700° C., to a thickness between about 500 to 2000 Angstroms.

7. The method of claim 1, wherein said fourth silicon oxide layer is deposited using LPCVD or PECVD procedures, at a temperature between about 500° to 700° C., to a thickness between about 500 to 2000 Angstroms.

8. The method of claim 1, wherein said second chemical mechanical procedure, is used to remove said third polysilicon layer from said third silicon oxide layer, forming said polysilicon columns, between about 2500 to 6000 Angstroms in height, in the top portion of said contact hole.

9. The method of claim 1, wherein said third silicon oxide layer, and said fourth silicon oxide layer, are removed via a dilute or buffered hydrofluoric acid HF solution, at a temperature between about 24° to 26° C.

10. The method of claim 1, wherein said dielectric layer is an oxidized-silicon nitride-silicon oxide (ONO) layer, at an equivalent silicon dioxide thickness between about 40 to 80 Angstroms, created by an initial thermal oxidation to form a fifth silicon oxide layer, between about 10 to 50 Angstroms, followed by a deposition of a second silicon nitride layer, to a thickness between about 10 to 20 Angstroms, and thermal oxidation of said second silicon nitride layer, creating a silicon oxynitride layer, on the underlying, said fifth silicon oxide layer.

11. The method of claim 1, wherein said dielectric layer is $Ta_2O_5$, obtained via radio frequency r.f. sputtering techniques, at a thickness between about 10 to 100 Angstroms.

12. The method of claim 1, wherein said fourth polysilicon layer, used for creation of said plate electrode of said STC structure, is deposited using LPCVD procedures, at a temperature between about 500° to 700° C., to a thickness between about 1000 to 2000 Angstroms.

13. A method of fabricating a stacked capacitor structure, (STC), for a DRAM device, in which a surface area of a storage node electrode is increased via use of a storage node electrode configuration, consisting of a lower shape of a flat, polysilicon plug, used for contact to an underlying transistor region, and of an upper polysilicon shape of polysilicon columns, extending above a top surface of said flat, polysilicon plug, comprising the steps of:

depositing a silicon nitride layer on an underlying transfer gate transistor, of said DRAM device;

depositing a first silicon oxide layer on said silicon nitride layer;

opening a contact hole in said first silicon oxide layer, and in said silicon nitride layer, to expose top surface of said underlying transistor region;

depositing a first polysilicon layer on top surface of said first silicon oxide layer, and on said top surface of said underlying transistor region, exposed in said contact hole;

anisotropic etching of said first polysilicon layer, forming said flat, polysilicon plug, recessed in said contact hole, with said top surface of said flat, polysilicon plug, in bottom portion of said contact hole, between about 2500 to 6000 Angstroms below the top surface of said first silicon oxide layer;

depositing a second polysilicon layer on the top surface of said flat, polysilicon plug, in the bottom portion of said contact hole, and also depositing said second polysilicon layer on the top surface of said first silicon oxide layer, in regions outside said contact hole;

depositing a second silicon oxide layer on said second polysilicon layer, completely filling top portion of said contact hole;

a first chemical mechanical polishing procedure to remove said second silicon oxide layer from a top surface of said second polysilicon layer, exposing the top surface of said second polysilicon layer, in the regions outside said contact hole, while leaving said second silicon oxide layer in the top portion of said contact hole;

a second chemical mechanical polishing procedure to remove said second polysilicon from the top surface of said first silicon oxide layer, in the regions outside said contact hole, exposing the top surface of said first silicon oxide layer, and creating said polysilicon columns on sides of the top portion of said contact hole, with said polysilicon columns overlying said flat, polysilicon plug, while leaving said second silicon oxide layer in the top portion of said contact hole, between said polysilicon columns;

selective, wet removal of said first silicon oxide layer, and of said second silicon oxide layer, exposing said storage node electrode, comprised of polysilicon columns, overlying, and extending above, the top surface of said flat, polysilicon plug, and also exposing said underlying transfer gate transistor, of said DRAM device, covered with said silicon nitride layer;

forming a dielectric layer on top surface of said storage node electrode;

depositing a third polysilicon layer on said dielectric layer; and patterning of said third polysilicon layer to form plate electrode, of said STC structure.

14. The method of claim 13, wherein said first silicon oxide layer is deposited using LPCVD or PECVD procedures, at a temperature between about 500° to 700° C., to a thickness between about 4000 to 10000 Angstroms.

15. The method of claim 13, wherein said contact hole is formed in said first silicon oxide layer, and in said silicon nitride layer, to a depth between about 4000 to 10000 Angstroms, via RIE procedures, using $CHF_3$ as an etchant.

16. The method of claim 13, wherein said first polysilicon layer is deposited using LPCVD procedures, at a temperature between about 500° to 700° C., to a thickness between about 1000 to 3000 Angstroms.

17. The method of claim 13, wherein said flat, polysilicon plug, is formed in the bottom portion of said contact hole via RIE procedures, using $Cl_2$ as an etchant, with a height of said flat, polysilicon plug between about 1500 to 4000 Angstroms, and with the top surface of said flat, polysilicon plug, between about 2500 to 6000 Angstroms below a top surface of said contact hole.

18. The method of claim 13, wherein said second polysilicon layer is deposited using LPCVD procedures, at a temperature between about 500° to 700° C., to a thickness between about 500 to 2000 Angstroms.

19. The method of claim 13, wherein said second silicon oxide layer is deposited using LPCVD or PECVD procedures, at a temperature between about 500° to 700° C., to a thickness between about 500 to 2000 Angstroms.

20. The method of claim 13, wherein said second chemical mechanical polishing procedure, is used to remove said second polysilicon layer, from said first silicon oxide layer, forming said polysilicon columns, between about 2500 to 6000 Angstroms in height, in the top portion of said contact hole.

21. The method of claim 13, wherein said second silicon oxide layer, and said first silicon oxide layer, are removed via selective wet etching, using a dilute or a buffered hydrofluoric acid solution, at a temperature between about 24° to 26° C.

22. The method of claim 13, wherein said dielectric layer is ONO, with an equivalent silicon oxide thickness between about 40 to 80 Angstroms, created by growing a third thin silicon oxide layer on said storage node electrode, at a thickness between about 10 to 50 Angstroms, depositing between about 10 to 20 Angstroms of a second silicon nitride layer, and oxidizing said second silicon nitride layer to from a silicon oxynitride layer on said third thin silicon oxide layer.

23. The method of claim 13, wherein said dielectric layer is $Ta_2O_5$, deposited using r.f. sputtering procedures, to a thickness between about 10 to 100 Angstroms.

24. The method of claim 13, wherein said third polysilicon layer is deposited using LPCVD procedures, at a temperature between about 500° to 700° C., to a thickness between about 1000 to 2000 Angstroms.

25. The method of claim 13, wherein said plate electrode is created via RIE procedures of said second polysilicon layer, using $Cl_2$ as an etchant.

* * * * *